United States Patent [19]

Pisharody

[11] Patent Number: 5,039,655

[45] Date of Patent: Aug. 13, 1991

[54] THIN FILM MEMORY DEVICE HAVING SUPERCONDUCTOR KEEPER FOR ELIMINATING MAGNETIC DOMAIN CREEP

[75] Inventor: Raghavan K. Pisharody, Palo Alto, Calif.

[73] Assignee: Ampex Corporation, Redwood City, Calif.

[21] Appl. No.: 387,202

[22] Filed: Jul. 28, 1989

[51] Int. Cl.$^5$ .................. G11C 11/14; G11C 11/44
[52] U.S. Cl. ............................ 505/1; 365/161; 505/701; 505/703
[58] Field of Search .............. 365/160, 161, 162; 505/1, 701, 703, 834, 835, 836

[56] References Cited

U.S. PATENT DOCUMENTS

| | | | |
|---|---|---|---|
| 3,341,827 | 9/1967 | Slade | 365/160 |
| 3,452,333 | 6/1969 | Ahrons | 365/160 |
| 3,541,532 | 11/1970 | Newhouse et al. | 365/160 |

FOREIGN PATENT DOCUMENTS

| | | | |
|---|---|---|---|
| 61-153897 | 7/1986 | Japan | 365/160 |
| 64-10486 | 1/1989 | Japan | 365/160 |

OTHER PUBLICATIONS

S. Sunshine et al., "Structure and Phys. Prof. of Single Crystals of the 84-K Superconductor $Bi_{2.2}Sn_2CA_{0.8}Cu_2O_{8+s}$", Physical Rev. B, vol. 38#1, Jul. 1, 1988, pp. 893-896.
R. Broom et al., "Josephson Memory Cell . . . ", IBM Tech. Discl. Bull., vol. 20, #7, Dec. 1977, pp. 2839-2840.
C. Michel et al., "Superconductivity in the Bi-Si-Cu-O System", Z. Phys. B-Condensed Matter, Oct. 1987, vol. 68, pp. 421-423.
H. Maeda, "A New High-Tc Oxide Superconductor without a Rare Earth Element", Jap. J.A.P., vol. 27, #2, Feb. 1988, pp. L209-L210.
J. Carisio, Dupont Corporate News, 2-9-88, pp. 1, 2.
M. Subramanian et al., "A New High-Temperature Supercond.: $Bi_2Sr_{3-x}Ca_xCu_gO_{8+y}$", Science Reports, vol. 239, Feb. 26, 1988, pp. 1015-1017.
C. Chu et al., "Superconductivity Up to 114K in the Bi-Al-Ca-Sr-Cu-O Comp. Sys. w/o Rare Earth Elem.", Phys. Rev. Lett., vol. 60, #10, Mar. 7, 1988, pp. 941-943.
R. Hazen et al., "Superconductivity in the High-Tc Bi-Ca-Sr-Cu-O System: Phase IO", Phys. Rev. Lett., vol. 60, #12, Mar. 21, 1988, pp. 1174-1177.
R. van Dover et al., "Crit. Curr. Den. in Single-Crystal $Bi_{2.2}Sr_2Ca_{0.8}Cu_2O_{8+d}$", Appl. Phys. Lett., May 30, 1988, pp. 1910-1912.
"Are the Days Numbered for Plated-Wire Memories?", Electronics, Oct. 1, 1987, p. 31, W. Iversen.

Primary Examiner—Joseph E. Clawson, Jr.
Attorney, Agent, or Firm—Elizabeth E. Strnad

[57] ABSTRACT

A thin film magnetic array memory affords relatively high packing densities while avoiding the problem of magnetic domain creep through the use of thin films of superconducting material disposed on the work lines of the memory. The superconducting films shunt magnetic fields generated by currents carried within the word lines and prevent these fields from adversely affecting adjacent memory cells in the array. By constraining the magnetic fields with the use of the superconducting films, the word lines can be packed close to one another in the array structure, thereby increasing the amount of information that can be stored in a unit area of the array.

17 Claims, 2 Drawing Sheets

THIN FILM MEMORY DEVICE HAVING SUPERCONDUCTOR KEEPER FOR ELIMINATING MAGNETIC DOMAIN CREEP

BACKGROUND OF THE INVENTION

The present invention is directed to memory devices for storing digital information, and is more particularly directed to thin film memory devices for storing the information in the form of magnetic states.

Memory devices which enable the user to selectively write, or store, information therein and subsequently read information therefrom are referred to as random access memories (RAMs). One type of RAM that is commonly employed as the main memory in many computers is a dynamic RAM. This type of RAM stores information by means of capacitive memories, in which the voltage stored in a particular capacitor represents a specific bit of information. In order to maintain the voltage levels in the storage capacitors, the memory must be continuously replenished with electrical charges. As such, this type of memory requires a constant source of electrical power to be connected to it, to carry out the replenishing function. If the source of electrical power is disconnected, the charges in the storage capacitors eventually dissipate, and the stored information is lost. This type of memory device is often referred to as a "volatile" memory because of this characteristic.

Although volatile memories have obtained widespread popularity in certain applications such as computers, their need for a constant source of electrical power renders them unsuitable for other applications. For example, in automobiles which employ digital indicators on the dashboard, a non-volatile memory, which does not require a constant source of electrical power, is necessary to store certain information, such as the total mileage reading for the odometer and the like. Furthermore, in other applications, such as military applications, any memory device which is employed must be insensitive to radiation and the like, and be capable of providing a non-destructive readout, in addition to being nonvolatile.

To provide these features, magnetic array memory devices which store the digital information in the form of magnetic states, rather than capacitive charges, have been employed. Basically, a magnetic array memory device comprises a plurality of conductive bit lines which are parallel to one another, and another plurality of conductive word lines which are parallel to one another and orthogonal to the bit lines. A magnetic storage cell is formed by a magnetically coercive material located at the intersection of each word line and each bit line. When currents are passed through a word line and a bit line, a net magnetic field is generated at their intersection. The direction of this magnetic field is stored as a magnetic dipole in the magnetically coercive material at the intersection of the word and bit lines. The direction of this dipole can be subsequently sensed, using inductive techniques, to read the stored bit of information.

In an effort to increase the packing density of magnetic array memories, and thereby increase the amount of information that can be stored per unit area, thin film technologies have been employed in the fabrication of these memories. Basically, a thin film magnetic array memory comprises an insulative substrate, e.g., silicon, having the bit lines deposited thereon. Each bit line consists of a thin metal conductor, such as aluminum. The intersecting word lines, which also comprise thin metal conductors, are overlaid upon the bit lines. At the intersection of each word line and bit line, a thin film of magnetically coercive material, preferably permalloy, is interposed between the word lines and bit lines. This magnetically coercive material forms the magnetic memory cells in which bits of information are stored.

Thin film magnetic array memories offer considerable advantages over previous magnetic array memory technologies, both in terms of cost to manufacture and packing density. However, the structure of the thin film array presents practical limitations on the packing densities that can be achieved. More particularly, by the very nature of thin film technology, the word lines are located very close to the bit lines. As efforts are made to increase packing densities the word lines also become located closer to one another. As a result, any given word line is located relatively close to the memory cell defined by the intersection of an adjacent word line and a bit line, and the magnetic field generated around the word line of interest could adversely affect the information stored in adjacent memory cells. Specifically, when current is passed through the word line to read data from the memory, the magnetic field created by this current causes the edge domains of the magnetic states stored in adjacent memory cells to expand, or "creep", in the direction of the bit lines, under the influence of dynamic orthogonal fields from the word lines. Consequently, the density of the magnetic domain stored at the immediate intersection of a word line and a bit line gradually decreases, with a resulting decrease in signal level that can be obtained when inductively reading the stored state. After multiple read operations, the signal level may have decreased to the point where it is not possible to reliably detect the bits stored in the memory.

One type of attempt to eliminate this problem of domain creep has been to magnetically shield the magnetic fields generated by the word lines from one another. In this approach, a magnetic shielding material, such as permalloy, is placed around each word line to prevent the field generated by a word line from penetrating to other word lines. This approach is not without attendant limitations, however. For example, in order to effectively shield the magnetic fields, the magnetic shielding material has to be relatively thick. The requirement for thick films around each word line adds to the overall bulk of the memory device, and again imposes a practical limitation on the density with which the word lines can be packed adjacent one another. In addition, the magnetic shielding film must be removed from the bit lines so as not to adversely affect the operation of the memory device. This need to remove the film from certain portions of the device adds to the number of processing steps that are required, and therefore increases the overall cost of the device.

Accordingly, it is desirable to provide a thin film magnetic array memory that offers increased packing density without the need to employ a thick magnetic shielding film around the word lines to prevent magnetic domain creep.

BRIEF STATEMENT OF THE INVENTION

In accordance with the present invention, a thin film magnetic array memory which affords relatively high packing densities eliminates the problem of magnetic creep with the use of thin films of superconducting material. Unlike magnetic shielding materials, which block magnetic fields, superconducting films shunt magnetic fields due to the Meissner effect. In accordance with the present invention, films of superconducting material are disposed around the word lines in a thin film magnetic array memory to prevent the magnetic field generated by one word line from affecting memory cells associated with adjacent word lines. Since the superconducting material effectively shunts the magnetic field, rather than shields it, it is possible to employ a thin film of the material to achieve the desired effect. As a result, the word lines can be located quite close to one another without experiencing magnetic domain creep, thereby offering increased packing density.

The foregoing principles of the present invention, as well as the advantages offered thereby and more specific features thereof, are described in greater detail hereinafter with reference to a preferred embodiment of the invention illustrated in the accompanying drawings.

DESCRIPTION OF THE ILLUSTRATED EMBODIMENT

Figure 1:
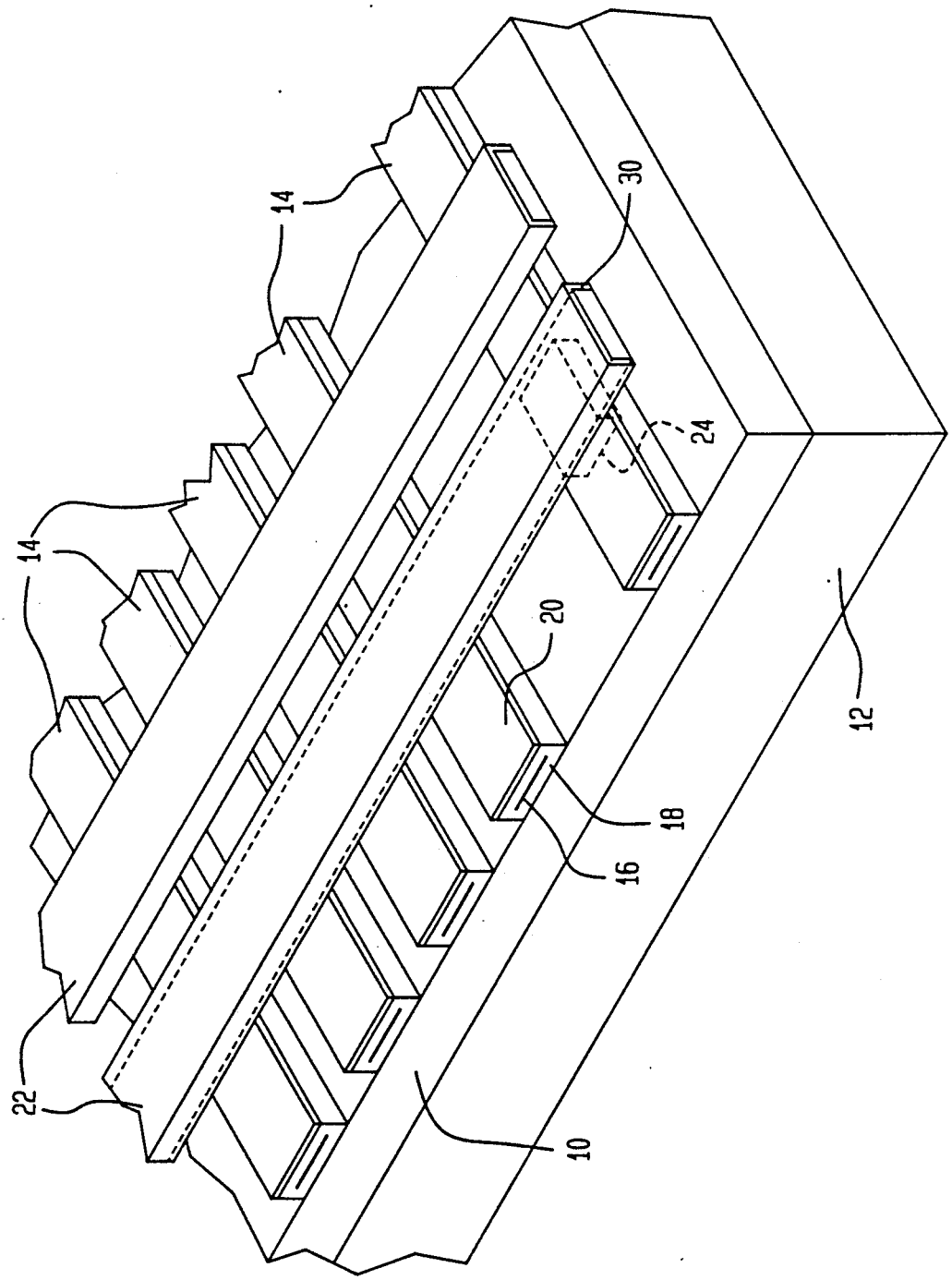
FIG. 1 is a perspective view of a thin film magnetic array memory embodying the principles of the present invention.

A thin film magnetic array memory device of the type to which the present invention pertains is illustrated in FIG. 1. The memory device is formed on a substrate comprising a layer of insulating material 10 formed upon a ground plane 12. To facilitate production of the memory device using known semiconductor processing techniques, the device is preferably formed with materials commonly employed in these processes. Thus, for example, the ground plane 12 can be suitably doped silicon, and the insulating layer 10 might be formed of silicon dioxide.

A plurality of bit lines 14 are disposed on the insulating layer 10. Each bit line comprises a thin metallic conductor 16 surrounded by a film of magnetically coercive, highly permeable material 18. Preferably, the metallic conductor 16 is comprised of aluminum, and the film 18 is formed with permalloy, cobalt-nickel alloy, or other highly permeable, coercive magnetic material. An insulating film 20, such as silicon dioxide, is deposited over each bit line.

Overlaid and supported on the bit lines are a plurality of parallel word lines 22. The word lines are oriented generally perpendicular to the bit lines 14. If necessary, the word lines can be supported over the bit lines by any suitable structure (not shown), such as a field insulating layer formed of the same material as the insulating film 20 on the bit lines. The intersection of a bit line 14 and a word line 22 defines a memory cell 24 within the magnetic material 18 of the bit line.

Figure 2:
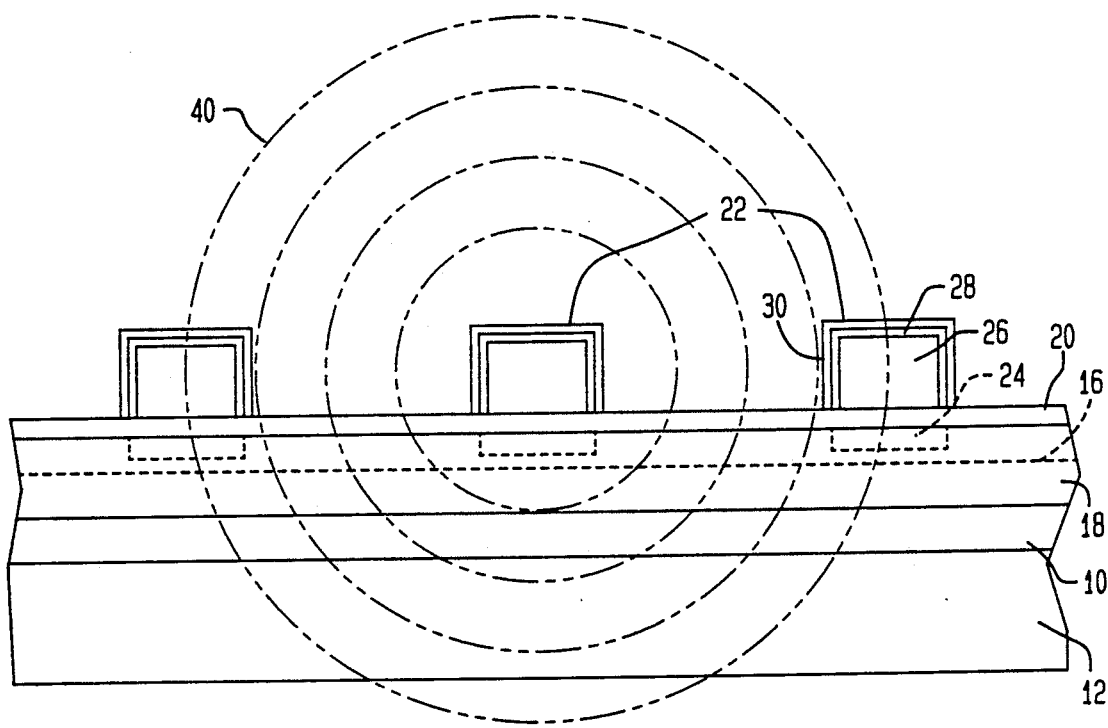
FIG. 2 is an end view of the array structure illustrating the configuration of the word lines in greater detail.

The construction of the word lines 22 is illustrated in greater detail in the end view of the memory device shown in FIG. 2. Referring thereto, a word line consists of a strip of conductive material 26 which carries an electrical current during reading and writing operations. The electrical material is covered on three sides by a thin film of insulating material 28. This insulating material can be contiguous with the insulating film 20 on the bit lines, so that the conductive material 26 is completely surrounded by an insulator. Disposed around the insulator is a thin film of superconducting material 30. This film covers the three sides of the word line which are not adjacent the bit line, and is not interposed between a bit line and a word line so as not to adversely affect desired magnetic fields generated by the word line.

Figure 3A:
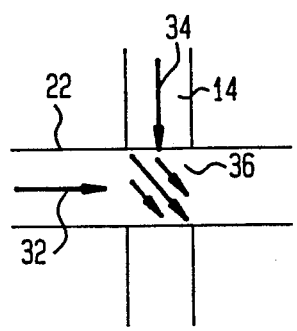
FIGS. 3A and 3B are top views of the intersection of a word line and a bit line illustrating the net field formed by currents flowing in the lines.

In operation, to write a bit of information into a memory cell 24, a current is passed through the conductive portion 26 of a word line 22 in a predetermined direction, as indicated by the arrow 32 in FIG. 3a. In addition, a current is passed through the thin metal conductor 16 of a bit line 14 in a particular direction, as indicated by the arrow 34. Each current establishes a magnetic field around its conductor, and at the intersection of a word line and a bit line a resultant magnetic field is formed. Within the magnetically coercive material 18 that is disposed between the word line and the bit line, the resultant magnetic field has an orientation as shown by the arrows 36 in FIG. 3a. Generally speaking, the magnetic field is oriented at an angle of approximately 45° with respect to the longitudinal directions of each of the word and bit lines. This resulting magnetic field causes the magnetic domains within the coercive material 18 to be oriented in the same direction, and thereby store a bit of information.

Figure 3B:
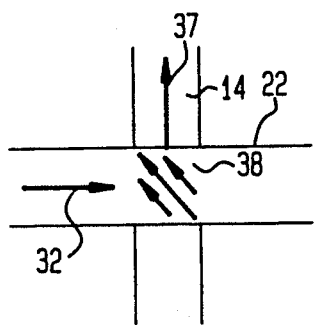

Referring to FIG. 3b, when the current passes through the bit line 14 in the opposite direction, as shown by the arrow 37, the resultant magnetic field between the word line and the bit line is oriented in the direction shown by the arrows 38. This field causes the magnetic domains within the magnetically coercive material 18 forming the memory cell 24 to be oriented in the opposite direction. Thus, by controlling the direction of the current passing through the bit lines 14, in conjunction with the application of a current to a word line, complementary bits of information can be selectively stored within the memory cells.

To read the information stored within the memory cells, a smaller current is passed through a word line of interest, and the orientation of the magnetic domains is inductively sensed through the bit lines.

In order to increase the amount of information that can be stored in a memory, it is desirable to locate the individual word lines 22 as close to one another as practically possible. By placing the word lines close to one another, a greater number of word lines can be incorporated within the array structure, thereby increasing the number of bits that are stored on each bit line. However, as the word lines are placed closer and closer to one another, the magnetic field that is generated when a current passes through a word line can begin to adversely affect the information stored in the memory cells associated with adjacent word lines.

Referring again to FIG. 2, the magnetic field that is generated when a current passes through a word line 22 is illustrated by the concentric dashed lines 40. As can be seen, this magnetic field passes through the memory cells 24 associated with adjacent word lines 22. When the word lines are spaced relatively far apart, the portion of the magnetic field passing through the adjacent memory cells is relatively weak, and therefore does not affect the magnetic domains within these cells. However, as the word lines are spaced more closely together, the strength of the magnetic field passing through the adjacent memory cells increases. When it is strong enough, this magnetic field can cause the boundaries of the magnetic domains, which define the memory cell 24, to "creep". In other words, the area of the memory cell 24 begins to expand in the longitudinal direction of the bit line 14. As a result, the density of the magnetic field stored in the memory cell is reduced, and the strength of the magnetic signal that can be inductively sensed in the bit line when a current is passed through the word line decreases. After multiple read operations, in which a dynamically changing field passes through the adjacent memory cells 24, the magnetic domain can creep to the extent that reliable readings of the stored information can no longer be made.

By employing a thin film 30 of superconducting material around the three sides of the word line 22 that are not adjacent a bit line, however, this problem can be avoided. In essence, the superconducting material effectively shunts the magnetic field created by the current in the word line, due to the Meissner effect. Thus, rather than penetrating outwardly from the word line in all directions as shown by the dashed lines 40, the magnetic field is directed downwardly into the magnetic storage material 18 of the bit line. With this arrangement, the magnetic field is confined to the area in which it is useful, i.e. within the magnetic storage cell beneath the word line from which it is generated, and does not adversely affect the magnetic domains in storage cells associated with other word lines. As a result, the word lines can be located as close to one another as can be practically obtained with thin film processing technique, thereby significantly increasing the packing density of the memory array.

In a preferred embodiment of the present invention, the central conductive portion 26 of the word line is also made from a superconducting material. Preferably, this superconducting material is the same as that which is employed in the thin exterior film 30. Examples of superconducting materials which may be utilized in the context of the present invention are yttrium barium copper oxide ($YBa_2Cu_3O_7$), lanthanum-barium copper oxide (($La,Ba)_2CuO_4$), bismuth calcium-strontium copper oxide (Bi-(Ca,Sr)-Cu-O) and thallium calcium barium copper oxide (Tl-Ca-Ba-Cu-O). These materials exhibit superconducting effects at or near liquid nitrogen temperatures.

It will be appreciated by those of ordinary skill in the art that the present invention can be embodied in other specific forms without departing from the spirit or essential characteristics thereof. For example, the word lines could be directly deposited on the substrate, and the bit lines overlaid upon the word lines. Or, in another embodiment, bit lines can be disposed on both sides of the word lines, to provide two magnetic storage cells per bit of information, and thereby increase signal strength.

The presently disclosed embodiment is therefore considered in all respects to be illustrative and not restrictive. The scope of the invention is indicated by the appended claims rather than the foregoing description and all changes that come within the meaning and range of equivalence thereof are intended to be embraced therein.

What is claimed is:

1. A thin-film magnetic array memory device, comprising:
    a substrate;
    a plurality of bit lines disposed on said substrate in parallel with one another, each bit line comprising a conductive material surrounded by a material having a high magnetic coercivity and high permeability, capable of storing magnetic states therein; and
    a plurality of word lines disposed on said bit lines parallel to one another and transverse to said bit lines to form a matrix of memory cells respectively located at the intersection of a word line and a bit line, each word line comprising an electrically conductive material, an electrically insulating material disposed between said word lines and said bit lines and around those portions of the electrically conductive material which are not adjacent a bit line, and a film of superconductive material disposed on those portions of said insulating material which are not adjacent a bit line.

2. The memory device of claim 1 wherein said electrically conductive material in said word lines comprises a superconductive material.

3. The memory device of claim 2 wherein said electrically conductive material of said word lines is the same as the superconductive material in the film disposed on said insulating material.

4. The memory device of claim 1 wherein each word line has a substantially rectangular cross-section, and wherein one side of the word line is disposed adjacent the bit lines and is separated therefrom by said electrically insulating material, and the other three sides of the word line are covered by said film of superconductive material, with a layer of said electrically insulating material disposed between said word line and said film of superconductive material.

5. The memory device of claim 1 wherein said magnetically coercive material comprises nickel iron alloys.

6. The memory device of claim 1 wherein said magnetically coercive, highly permeable material comprises cobalt-nickel alloy.

7. The memory device of claim 1 wherein said superconductive material comprises yttrium barium copper oxide.

8. The memory device of claim 1 wherein said superconductive material comprises lanthanum-barium copper oxide.

9. The memory device of claim 1 wherein said superconductive material comprises bismuth calcium-strontium copper oxide.

10. The memory device of claim 1 wherein said superconductive material comprises thallium calcium barium copper oxide.

11. In a thin film magnetic array memory device of claim 1, the device being made comprising the steps of:
    providing a plurality of parallel bit lines on a nonmagnetic substrate, each bit line comprising a conducting material surrounded by a high coercivity, high permeability magnetic material, capable of storing magnetic states therein;
    providing on said bit lines an electrically insulating material; and
    providing on said electrically insulating material a plurality of parallel word lines transversely to said bit lines to form a matrix of memory cells located at intersections of said word lines and bit lines, each word line comprising an electrically conducting material, an electrically insulating material surrounding those portions of said conducting material which are not adjacent a bit line, and providing a film of superconducting material on those portions of said insulating material surrounding said word line which are not adjacent said bit line.

12. The device of claim 11 wherein the step of providing a plurality of parallel word lines comprises providing each word line with a generally rectangular cross section, providing one side of each word line facing the bit lines, and wherein said step of providing said film of superconducting material comprises coating by said film of superconducting material three sides of said word line which do not face the bit lines.

13. The method of claim 11 further including the step of forming an insulating layer between each word line and the film of superconducting material coated thereon.

14. The device of claim 11 wherein said superconducting material comprises yttrium barium copper oxide.

15. The device of claim 11 wherein said superconducting material comprises lanthanum-barium copper oxide.

16. The device of claim 11 wherein said superconducting material comprises bismuth calcium-strontium copper oxide.

17. The device of claim 11 wherein said superconducting material comprises thallium calcium barium copper oxide.

* * * * *